(12) United States Patent
Liu et al.

(10) Patent No.: US 6,489,783 B1
(45) Date of Patent: Dec. 3, 2002

(54) TEST DEVICE AND METHOD (75) Inventors: Jian-Yu Liu, Hsinchu (TW); Ming-Yi Lay, Hsinchu (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/715,227

(22) Filed: Nov. 17, 2000

(30) Foreign Application Priority Data

Jan. 20, 2000 (TW) ........................................ 89100919 A (51) Int. Cl.[7] .............................................. G01R 27/26
(52) U.S. Cl. ........................................................ 324/663
(58) Field of Search ................................ 324/663, 659, 324/637, 638, 648, 548, 768; 361/306.1, 306.2, 502; 438/239, 240

(56) References Cited

U.S. PATENT DOCUMENTS 4,683,417 A * 7/1987 De Burgat et al. ....... 324/60 C
4,906,939 A * 3/1990 Berrigan et al. ............. 324/548
5,936,409 A * 8/1999 Nishioka .................... 324/548
6,094,788 A * 8/2000 Farahmandi et al. ....... 25/25.41

* cited by examiner

Primary Examiner—N. Le
Assistant Examiner—Etienne P LeRoux
(74) Attorney, Agent, or Firm—Dann, Dorfman, Herrell and Skillman; Henry H. Skillman (57) ABSTRACT A time dependent dielectric breakdown (TDDB) test device is used for testing a dielectric layer to obtain a time to failure (TTF) data, wherein the TDDB test device is electrically connected between a power source and a current detector and the dielectric layer includes at least a first capacitor and a second capacitor formed about selected first and second locations of the dielectric layer. The device includes a first current-limiting apparatus electrically connected to the first capacitor in series, a second current-limiting apparatus electrically connected to the second capacitor in series and the first current-limiting apparatus in parallel, and a voltage-regulating apparatus electrically connected to the second current-limiting apparatus in series. It also provides a method for implementing such device.

19 Claims, 5 Drawing Sheets

TEST DEVICE AND METHOD

FIELD OF THE INVENTION

The present invention relates to a test method or architecture, and more particularly to one for testing a dielectric layer.

BACKGROUND OF THE INVENTION

Up to the present, the test method for testing chips in the manufacturing process mainly is categorized into two types. One is to arrange the circuit lines in the test circuit beforehand after accomplishing the manufacturing procedure for package. It can test the inner of the chips through the specific pins after they are packaged. However, this test method is inefficient because it only performs the testing action after accomplishing the chip packaging. If there are some errors occurring in the manufacturing process or are some bugs present in the chip design to cause the chip incapable of anticipatively performing, the cost for performing the packaging procedure after accomplishing the manufacturing process will be wasted.

Another is to perform the test during the chips manufacturing process, which generally is called Wafer Accept Test (WAT). One generally accepted method for testing the dielectric layer is named Time Dependent Dielectric Breakdown (TDDB). The mechanism of TDDB is to form a test key of a dielectric layer in a wafer, and then an equivalent circuit of the test key can be treated as a capacitor. We can test the capacitors to estimate the characteristic and the lifetime of the dielectric layers of the chips being made of the same wafer. The implementing procedure is as follows:

Step 1: Setting a voltage value Vs in a Source Measurement Unit (SMU);

Step 2: Probing a test structure (having thereon the capacitors), applying thereto the voltage of Vs until there is a breakdown in either one of the capacitors, and recording a Time to Failure (TTF);

Step 3: Probing the next test structure and continuing the testing procedure until the amount of testing samples is enough to proceed the next Step 4, or else to go back to Step 2;

Step 4: Providing a deviation voltage DV smaller than the voltage of Vs, i.e. DV=Vs−ΔV, and executing the involved method from Step 2;

Step 5: Processing the next Step 6 if the amounts of testing samples under the conditions of three different voltage values are enough, otherwise going back to Step 2; and Step 6: Calculating the lifetime and the voltage acceleration factor β of the test structure according to the above collected data.

Although the above-mentioned test procedure can earlier obtain the result through testing the chip and cost less development cost, such method still has the defects as follows:

1. It costs more testing time, particularly needing to test multiple test structures for obtaining enough amount of testing samples if there is only one capacitor in each one of multiple test structures.

2. When there are multiple capacitors in the test structure, a SMU merely adopts a voltage value and tests a capacitor using this voltage value at a time. At the same time, the SMU can't execute any other things.

Moreover, there still are some misgivings about the possible pollution and oxidization in the unpackaged surface of the wafer if the test time for testing the dielectric layer is excessively prolonged.

Therefore, it will be important how to improve the test device for testing a dielectric layer to provide a plurality of voltages for a SMU to test a plurality of capacitors at the same time, and to have the less test time.

It is therefore tried by the applicant to deal with the above situation encountered by the prior art.

SUMMARY OF THE INVENTION

It is therefore an object of the present invention to provide a method and architecture for testing a dielectric layer in the chip manufacturing process.

It is further an object of the present invention to provide a method and architecture for testing a dielectric layer, in which there is provided a single power source having a plurality of voltage value for testing a plurality of capacitors at the same time.

It is still an object of the present invention to provide a test method and architecture for testing a dielectric layer, in which the test time is reduced and the test efficiency is increased.

It is additional an object of the present invention to provide an architecture for testing a dielectric layer having an extensible and flexible framework in accordance with different test demands and purposes.

According to the present invention, a test device adapted to be electrically connected between a power supply and a current detector for testing a dielectric layer including a first capacitor and a second capacitor. The device includes a first current-limiting apparatus electrically connected to the first capacitor in series, a second current-limiting apparatus electrically connected to the second capacitor in series, and a voltage-regulating apparatus electrically connected to the second capacitor and the second current-limiting apparatus in series.

Certainly, the first current-limiting apparatus and the first capacitor electrically can be connected to the second current-limiting apparatus and the second capacitor.

Certainly, the current detector can probe an occurring current to determine a breakdown of the dielectric layer.

Preferably the breakdown is defined as a breakdown current of either one of the first capacitor and the second capacitor so that the breakdown current will flow through the one capacitor.

Preferably the breakdown current for the first capacitor has a first value, the breakdown current for the second capacitor has a second value, and the second value is different from the first value.

Certainly, the first current-limiting apparatus and the second current-limiting apparatus can be resistors.

Certainly, the voltage-regulating apparatus can be a diode.

Preferably the dielectric layer is formed in a process of making a chip.

According to a further aspect of the present invention, a test device adapted to be electrically connected between a power supply and a current detector for testing a dielectric layer including a plurality of capacitors. The device includes a plurality of current-limiting apparatuses electrically connected to the plurality of capacitors in series respectively, and at least a voltage-regulating apparatus electrically connected to the pluralities of current-limiting apparatuses and the capacitors in series.

Preferably the current detector probes an occurring current to determine a breakdown of the dielectric layer.

Preferably the breakdown is defined as a breakdown current of one of the plurality of capacitors so that the breakdown current will flow through the one capacitor.

Certainly, the occurring current values for the plurality of capacitors can be different from one another.

According to a yet aspect of the present invention, a test method includes steps of providing a test device for testing a dielectric layer including at least a first capacitor and a second capacitor, providing a voltage into the test device, and probing an occurring current to determine a breakdown current from either one of the first capacitor and the second capacitor.

Certainly, the method can further include providing a first current-limiting apparatus electrically connected to the first capacitor in series; providing a second current-limiting apparatus electrically connected to the second capacitor in series, and providing a voltage-regulating apparatus electrically connected to the second current-limited apparatus and the second capacitance in series.

Preferable the breakdown current for the first capacitor has a first value, the breakdown current for the second capacitor has a second value, and the second value is different from the first value The present invention may best be understood through the following descriptions with reference to the accompanying drawings, in which:

DETAILED DESCRIPTION OF THE PREFERRED EMBODIMENTS

The present invention will now be described more detailedly with reference to the following embodiment. It is to be noted that the following descriptions of the preferred embodiments of this invention are presented herein for the purpose of illustration and description only. It is not intended to be exhaustive or to be limited to the precise from disclosed.

Figure 1:
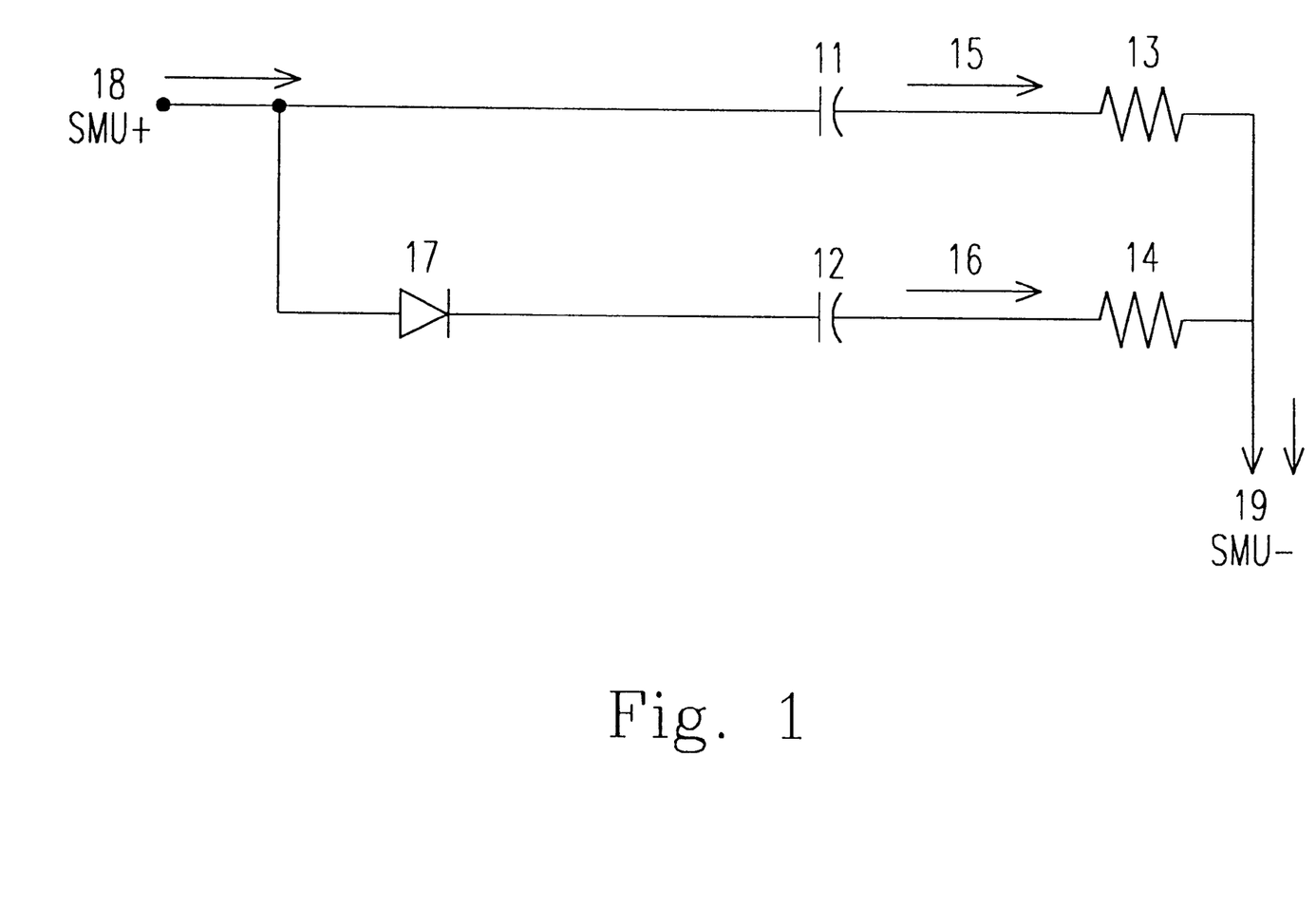
FIG. 1 is a schematic view showing the basic framework of the architecture for testing a dielectric layer according to the present invention.

Referring now to FIG. 1, it discloses a basic framework of the test device according to the present invention. The same test device includes a first capacitor 11 and a second capacitor 12 electrically connected to each other in parallel. The device further includes a first resistor 13 and a second resistor 14 electrically connected to the first capacitor 11 and the second capacitor 12 in series respectively. Furthermore, the first capacitor 11 and the second capacitor 12 have the same dielectric layer so that their capacitance values should be the same. Moreover, the resistance value (R1) of the fist resistor 13 is larger than the resistance value (R2) of the second resistor 14, namely R1>R2. In addition, a first diode 17 is electrically connected to the second capacitor 12 and the second resistor 14 in series.

A Source Measure Unit (SMU) has the function of power source and is capable of probing the current value. When implementing the testing steps, a specific voltage Vs is provided to the test device by the SMU. The voltage difference between the SMU positive end 18 and the SMU negative end 19 exists in the device. At the same time, there will be different voltage differences applied to the different components in the device. When any capacitor is not subject to breakdown, it can be regarded as an electrically breaking element, and thus in the initial test period, the voltage value applied to the first capacitor 11 is Vs, or a first voltage value 41 (V1). The voltage value applied to the second capacitor 12 is the one by subtracting the voltage value bridging across the first diode 17 from Vs to be the second voltage 42 (V2). Therefore, the second voltage value is less than the first voltage value. In addition, every capacitor is electrically breaking and thus every resistor fails to bridge thereacross any voltage so that the test device has no electric current produced.

When the first capacitor is subject to breakdown after a period of time, the capacitor becomes an electrically conducting element, the entire potential difference of the first voltage is bridged across the first resistor 13, and thus the device produces a first current 15 having the following value is:

First current 15 (I1)=First voltage 41 (V1)/First resistance 13 (R1)

By way of probing an occurring current in the SUM negative end 19, we can decide a breakdown of the capacitor through an occurring current value, and record a lifetime TTF of the first capacitor 11 at this time.

After a period of time, the second capacitor 12 is subject to a breakdown. There is a second current 16 occurring under the same principle, and the value is:

Second current 16 (I2)=Second voltage 42 (V2)/Second resistance 14 (R2)

The second voltage 42 (V2) is the voltage left after subtracting the voltage bridging over the first diode 17 from the first voltage 41 (VI). At this time, the occurring current probed in the SMU negative end 19 is the sum of the first current 15 and the second current 16. Furthermore, by way of probing the occurring current, we also can decide the breakdown of the second capacitor 12 and can record the lifetime TTF of the second capacitor 12.

Under the architecture for such a testing process, we not only can provide different power sources to test different capacitors just using a SMU, but also can decide each TTF of each capacitor without being limited to merely test a capacitor at one time. As long as the sum of all relevant currents is within the enduring range of the SMU, such the architecture can reduce the test time greatly.

For the test process in the practical operation, we provide three different voltages to measure the TTF for the test device in general. Thus, the further architecture for testing is shown as FIG. 2, showing an architecture of a preferred embodiment for test device according to the present invention.

Figure 2:
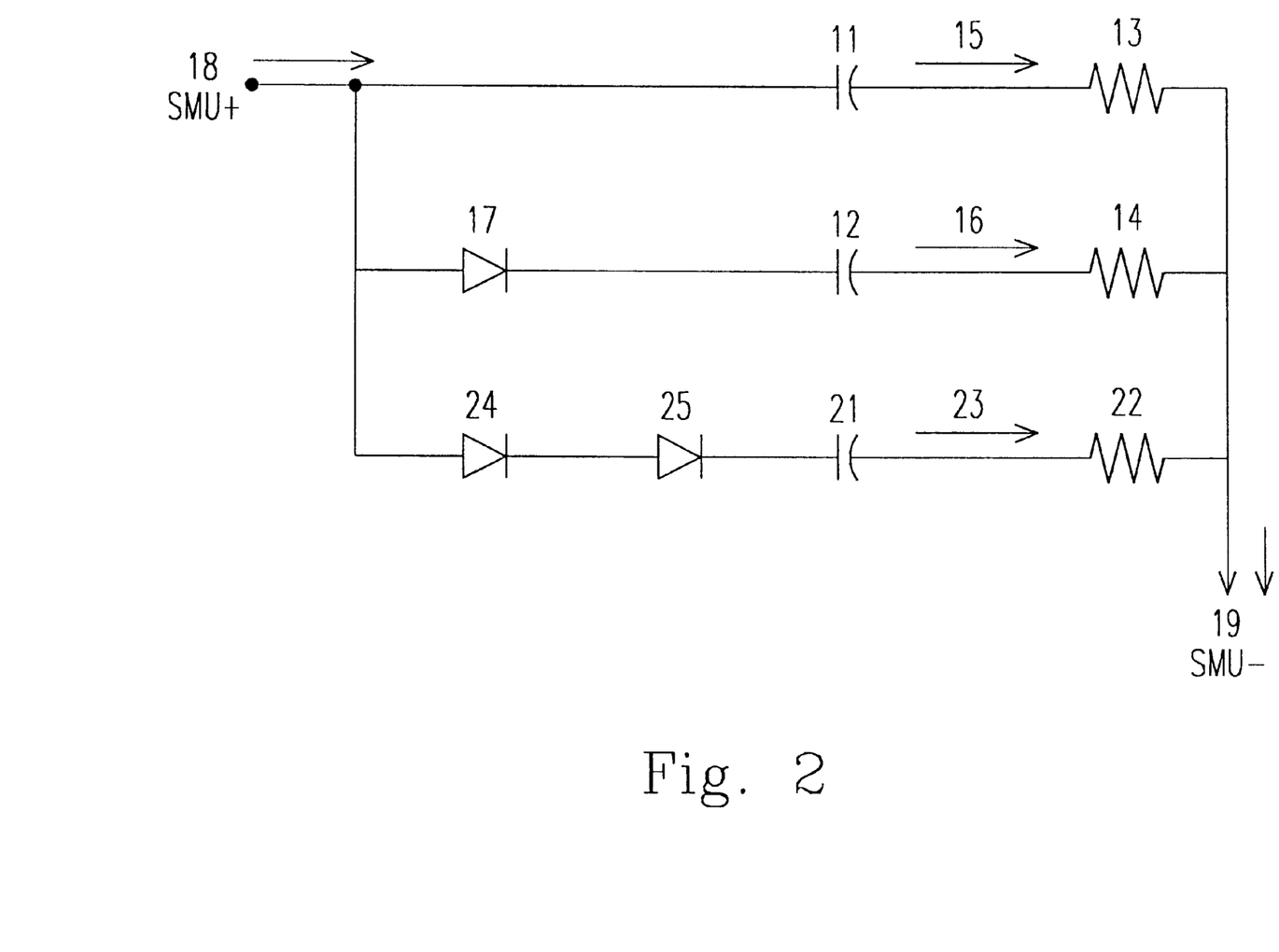
FIG. 2 a schematic view showing a preferred embodiment of the architecture for testing a dielectric layer according to the present invention.

In FIG. 2, there is a third capacitor 21 electrically connected to the foregoing two capacitors in parallel. Moreover, there are a third resistor 22, a second diode 24 and a third diode 25 electrically connected to the third capacitor 21 in series. The resistance value (R3) of the third resistor 22 is smaller than the resistance value (R2) of the second resistor 14. The working principle of calculating this figure is similar to that in the above-mentioned description. The third current 23 is due to the breakdown of the third capacitor 21 and is:

Third current 23 (I3)=Third voltage 43 (V3)/Third resistance 22 (R3)

As to the third voltage 43 (V3), it has a voltage value after subtracting the voltage bridging over the second diode 24 and the third diode 25 from the first voltage 41. The voltage across a diode is about a constant value so that we can use the diode number to obtain the desired the voltage value.

Figure 3:
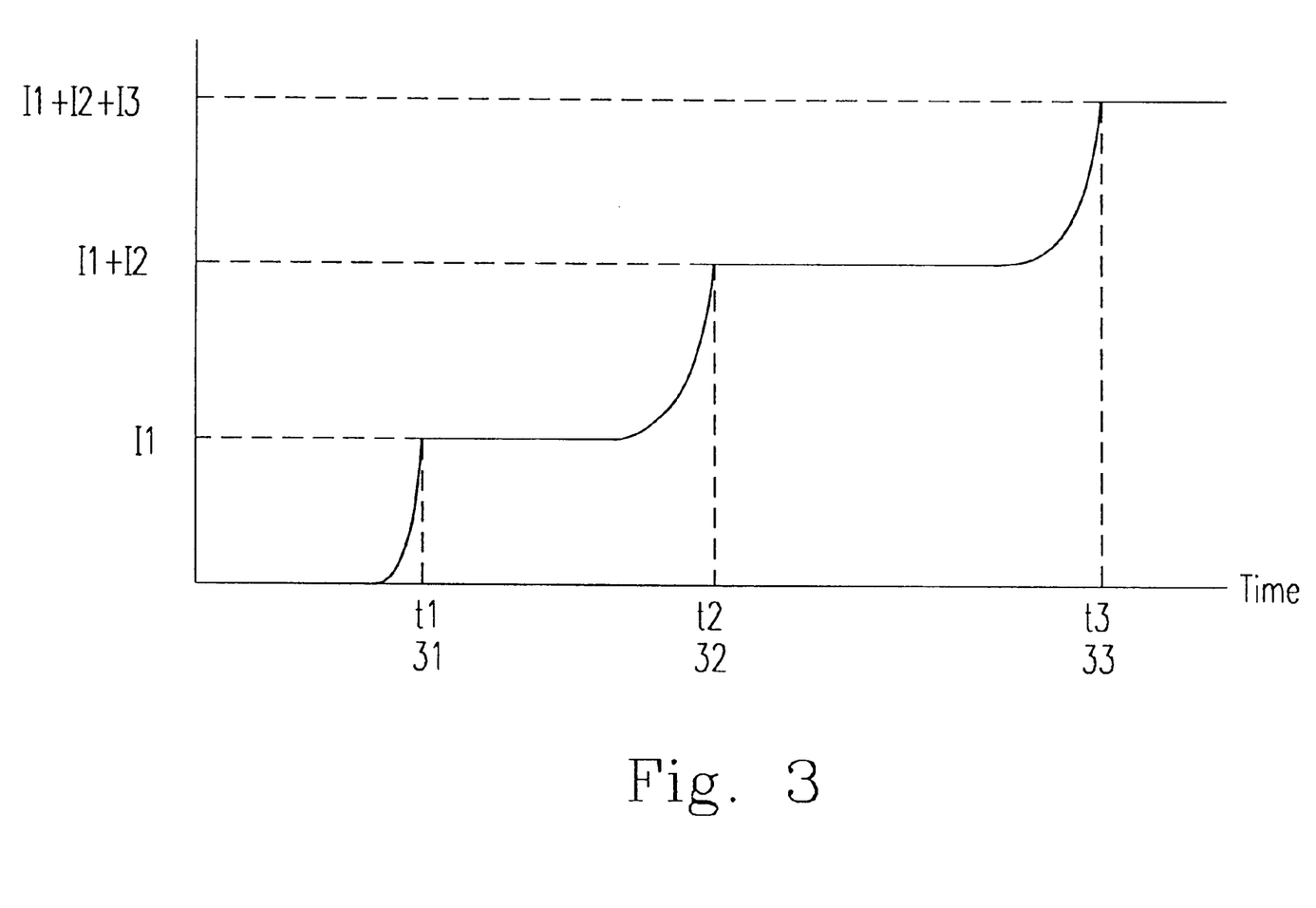
FIG. 3 is a plot of the breakdown current versus the breakdown time of the capacitors.

Accordingly, we can decide the occurring current in the SMU negative end 19 and use the current change to measure the TTF of the capacitor as shown in FIG. 3, the plot of the breakdown currents versus the breakdown time of the capacitors.

In FIG. 3, the symbol t1 or the first lifetime 31 on the transverse axis of the plot is the TTF of the first capacitor 11; t2 or the second lifetime 32 is the TTF of the second capacitor 12; and t3 or the third lifetime 33 is the TTF of the third capacitor 21. As observable in this plot, there is no current flowing through the device in the beginning of the test process. At t1, since the first capacitor is subject to a breakdown, there is the first current (I1) flowing through the device. At t2, since the second capacitor is subject to a breakdown, there is the second current (I2) occurring and the total current value is I1+I2. At t3, since the third capacitor is subject to a breakdown, the total current value raises to be I1+I2+I3. The difference among the currents is noticeable, and thus it is not difficult to measure them. Furthermore, we can easily get known to what are the enduring extents, when applied with the three different voltages, of the capacitors which are representative of the dielectric layer in the wafer.

Figure 4:
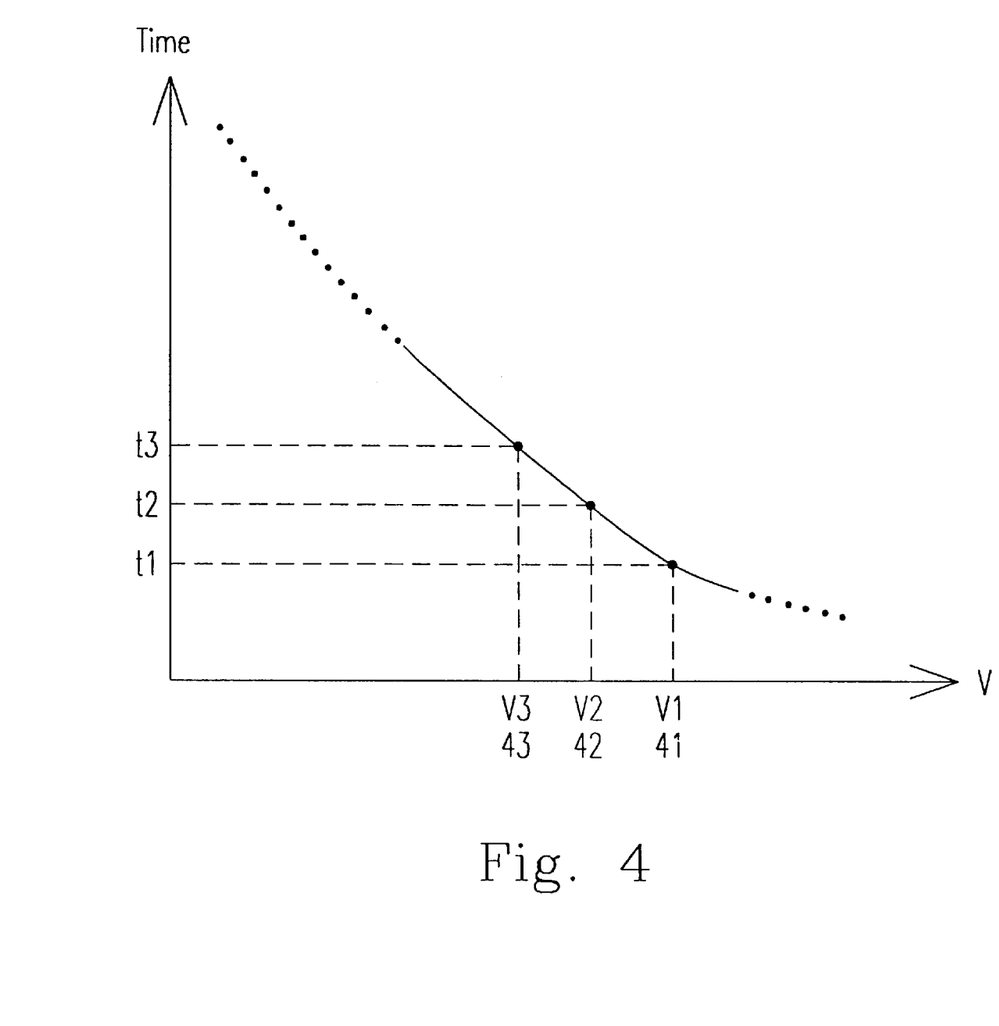
FIG. 4 is a plot of the lifetime (TTF) of the capacitor versus the applied voltage from the SMU.

With these data, we can estimate the lifetime TTF of a chip made of a specific wafer. The estimating method is shown in FIG. 4, a plot of TTF of the capacitors versus voltage values. After getting the three voltage values from the first voltage 41, the second voltage 42 and the third voltage 43, and their respective corresponding values of TTF, we can obtain the plot as shown in of FIG. 4, in which the slope of the plot curve is the voltage acceleration factor 13. We even can extend this curve to estimate the lifetime of the dielectric layer under the normal working voltage. At the same time, we also can deduce the normal operating lifetime of the components in the wafer.

From the above-mentioned architecture in FIG. 2, it has solved the problem that we use three voltage values to test the capacitor in practice rather than merely using two voltage values. This test method or device can test three capacitors by using three different voltages from the same SMU at the same time for minimizing the testing time by way of obviating the necessity of changing the voltage value in the past. However, we usually test a plurality of capacitors by way of using the same voltage, and calculate the average value of the TTFs of the plurality of capacitors to get more accurate value to estimate the lifetime of the components in the wafer. Accordingly, a further improved architecture of the test device for testing a dielectric layer is shown as FIG. 5.

Figure 5:
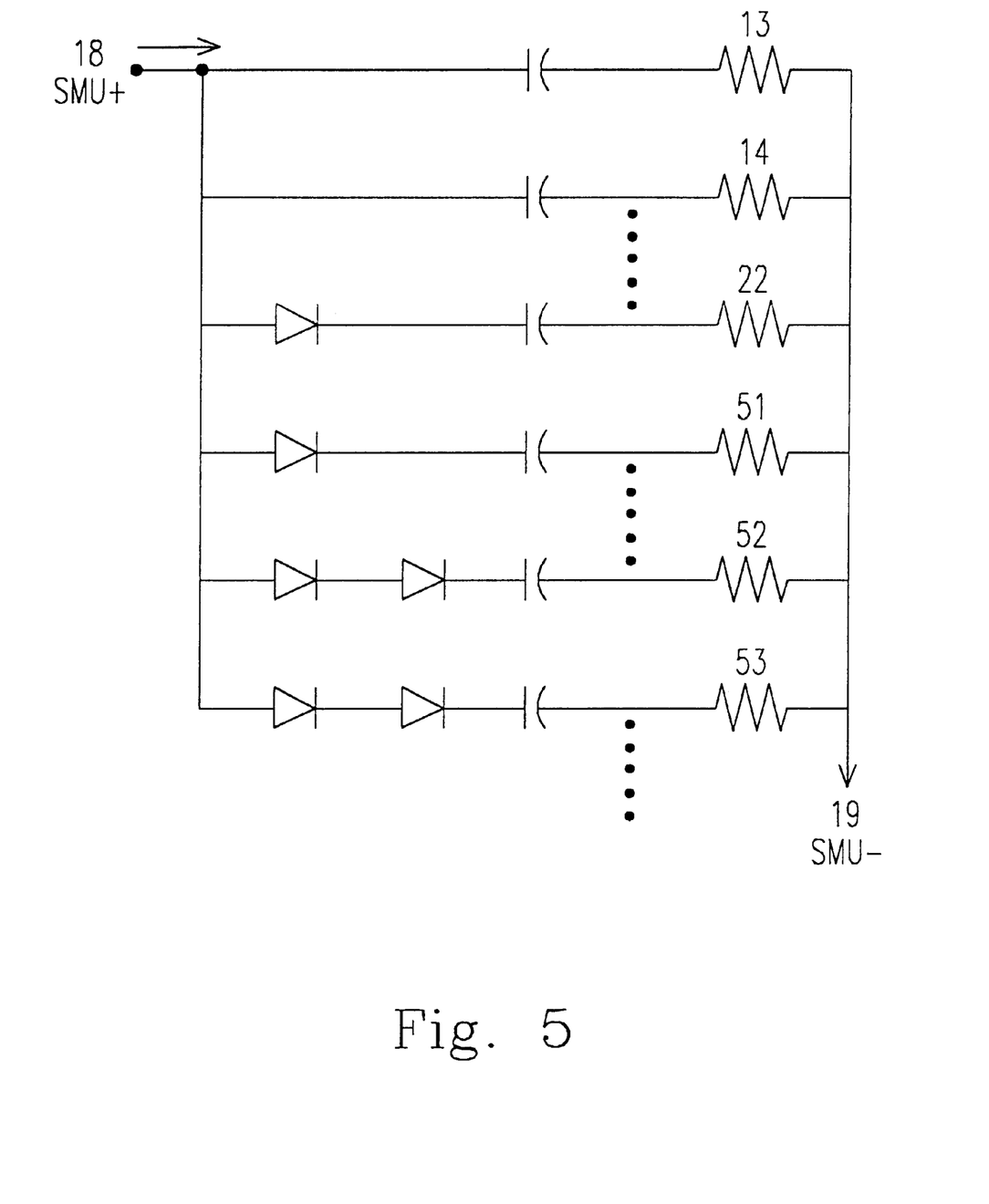
FIG. 5 is a schematic view showing a further preferred embodiment of the architecture for testing a dielectric layer according to the present invention.

Referring now to FIG. 5, this is shown a schematic view showing a further preferred embodiment of the architecture or method for testing a dielectric layer according to the present invention. There are more capacitors electrically connected to one another in parallel. For testing N capacitors with the same voltage, it needed to test N times in the past. For controlling the voltage, we can modulate the voltage value through controlling the amount of the diodes electrically connected to the capacitor in series so that there are N capacitors electrically connected to thereto no diode, N capacitors respectively electrically connected to one diode in series and N capacitors respectively electrically connected to two diodes in series. Any capacitor which is electrically connected to another one in parallel is also electrically connected to a resistor in series, and the respective resistance value is different from the others. In the illustration of FIG. 5, the resistance values R4, R5 and R6 of the fourth resistor 51, the fifth resistor 52 and the sixth resistor 53 are decreased gradually. It results in R1>R2>R3>R4>R5>R6 to have different occurring current values for being easy to be detected while different capacitors have respective breakdowns.

Such architecture according to the present invention, it can at a time solve the complex work which requires multiple different voltages and every voltage is to be applied to the plurality of capacitors. In the one time of probing work, we can obtain the TTF of all capacitors, calculate the voltage acceleration factor β and the lifetime in the chip, so that it can minimize the testing time. Furthermore, we can provide the capacitor at the specific location in the wafer, get the information of the specific location of the wafer through the TTF of the capacitor and obtain the facilitated analysis of abnormality of the chip by deciding whether there is an uniform distribution of the material in the wafer.

Accordingly, the improved test device or method according to the present invention provides a simplified framework or an easy practicing method. In addition, it is easy to expand and improve in accordance with the different purposes and goals for the test device. Moreover, the test device can handle multiple voltages and capacitors making shorten the test time.

In conclusion, the present invention can minimize the test time effectively for testing a dielectric layer in the wafer and decrease the debugging and manufacturing cost substantially. As far as the framework according to the present invention is concerned, it could be modified instantly for coping with the variable demands and purposes and thus has enough flexibility.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures. Therefore, the above description and illustration should not be taken as limiting the scope of the present invention which is defined by the appended claims.

What we claim is:

1. A time dependent dielectric breakdown (TDDB) test device for testing a dielectric layer to obtain time to failure (TTF) data, the dielectric layer having selected first and second locations about which a first capacitor and a second capacitor are formed, respectively, said TDDB device comprising:

a first current-limiting apparatus electrically connected to said first capacitor in series, to provide a first circuit branch;

a second current-limiting apparatus electrically connected to said second capacitor in series; and a voltage-regulating apparatus electrically connected to said second capacitor and said second current-limiting apparatus in series to provide a second circuit branch, said second circuit branch electrically connected to said first circuit branch in parallel and adapted to be electrically connected to a power source and current detector, the voltage-regulating apparatus adapted to provide a voltage drop across the second capacitor different from the voltage drop across the first capacitor, whereby the power source is adapted to provide a sufficient voltage to cause dielectric breakdown of at least one of said first and second capacitors, the breakdown detectable by said current detector to provide said TTF data.

2. The device according to claim 1, wherein said current detector is adapted to probe an occurring current to determine breakdown of said dielectric layer at the location associated with at least one of said first and second capacitors.

3. The device according to claim 2, wherein said breakdown is defined as a breakdown current of either one of said first capacitor and said second capacitor so that said breakdown current will flow through said capacitor experiencing breakdown.

4. The device according to claim 3, wherein said second current limiting apparatus has a preselected value to provide for a breakdown current for said second capacitor to have a different value from a breakdown current for said first capacitor.

5. The device according to claim 3, wherein said TTF data is determined by said breakdown current of said one capacitor.

6. The device according to claim 1, wherein said first current-limiting apparatus and said second current-limiting apparatus are resistors.

7. The device according to claim 1, wherein said voltage-regulating apparatus is a diode.

8. The device according to claim 1, wherein said dielectric layer is formed on a wafer.

9. The device according to claim 1, comprising a power source and current detector electrically connected to the first and second branches.

10. A time dependent dielectric breakdown (TDDB) test device for testing a dielectric layer to obtain time to failure (TTF) data, the dielectric layer having a plurality of selected locations about which a plurality of capacitors are respectively formed, said TDDB device comprising:
    a plurality of current-limiting apparatuses, each current-limiting apparatus electrically connected in series to a selected one of said plurality of capacitors, to provide a plurality of capacitor test branches electrically connected in parallel; and
    at least one voltage-regulating apparatus electrically connected in series to a selected one of said plurality of capacitor test branches, said plurality of test branches adapted to be electrically connected to a power source and current detector, the voltage-regulating apparatus adapted to provide a voltage drop across the selected capacitor different from the voltage drop supplied by the power source,
    whereby the power source is adapted to provide a sufficient voltage to cause dielectric breakdown of at least one of said plurality of capacitors, the breakdown detectable by said current detector to provide said TTF data.

11. The device according to claim 10, wherein said current detector is adapted to probe an occurring current to determine breakdown of said dielectric layer at the location associated with at least one of said plurality of capacitors.

12. The device according to claim 11, wherein said breakdown is defined as a breakdown current of one of said plurality of capacitors so that said breakdown current will flow through said capacitor experiencing breakdown.

13. The device according to claim 12, wherein each current limiting apparatus has a preselected value to provide for a different breakdown current for each one of said plurality of capacitors.

14. The device according to claim 12, wherein said TTF data is determined by said breakdown current of said one capacitor.

15. A time dependent dielectric breakdown (TDDB) test method for testing a dielectric layer to obtain time to failure (TTF) data, comprising steps of:
    providing a test device for testing said dielectric layer, said dielectric layer having selected first and second locations about which a first capacitor and a second capacitor are formed;
    providing a voltage into said test device; and
    probing an occurring current to determine a breakdown current from either one of said first capacitor and said second capacitor, thereby obtaining said TTF data of at least one of said at least first capacitor and said second capacitor.

16. The method according to claim 15, further comprising:
    providing a first current-limiting apparatus electrically connected to said first capacitor in series;
    providing a second current-limiting apparatus electrically connected to said second capacitor in series; and
    providing a voltage-regulating apparatus electrically connected to said second current-limited apparatus and said second capacitance in series.

17. The method according to claim 16, wherein said breakdown current for said first capacitor has a first value, said breakdown current for said second capacitor has a second value, and said second value is different from said first value.

18. The method according to claim 15, wherein said TTF data is determined by said breakdown current of said one capacitor.

19. A time dependent dielectric breakdown (TDDB) test device for testing a dielectric layer to obtain time to failure (TTF) data, comprising:
    a first capacitor disposed about and comprising a first selected portion of the dielectric layer;
    a second capacitor disposed about and comprising a second selected portion of the dielectric layer;
    a first means for limiting a current electrically connected in series to said first capacitor, to provide a first circuit branch;
    a second means for limiting a current electrically connected to said second capacitor in series; and
    a means for regulating voltage electrically connected in series to said second capacitor and said second current-limiting means to provide a second circuit branch, said first and second circuit branches electrically connected in parallel, said first and second branches adapted to be electrically connected to a power source and current detector, the power source adapted to provide a sufficient voltage to cause dielectric breakdown of at least one of said first and second capacitors, the breakdown detectable by said current detector to provide said TTF data.

* * * * *

UNITED STATES PATENT AND TRADEMARK OFFICE
CERTIFICATE OF CORRECTION

PATENT NO.     : 6,489,783 B1
DATED          : December 3, 2002
INVENTOR(S)    : Liu et al.

It is certified that error appears in the above-identified patent and that said Letters Patent is hereby corrected as shown below:

Column 5,
Line 36, "13" should be -- ß --;

Column 8,
Line 32, "claim 16" should be -- claim 15 --.

Signed and Sealed this

Eleventh Day of November, 2003

JAMES E. ROGAN
*Director of the United States Patent and Trademark Office*